United States Patent

London

[15] 3,703,669

[45] Nov. 21, 1972

[54] PHOTOCURRENT CROSS TALK ISOLATION

[72] Inventor: Arnold London, Tempe, Ariz.

[73] Assignee: Motorola, Inc., Franklin Park, Ill.

[22] Filed: Aug. 12, 1971

[21] Appl. No.: 171,300

Related U.S. Application Data

[63] Continuation of Ser. No. 797,202, Feb. 6, 1969, abandoned.

[52] U.S. Cl..........317/235 R, 317/235 E, 317/235 N, 317/235 AE, 317/235 NA

[51] Int. Cl...............................................H01l 15/00

[58] Field of Search....................317/235 N, 235 AE

[56] References Cited

UNITED STATES PATENTS

| | | | |
|---|---|---|---|
| 3,573,509 | 4/1971 | Crawford | 307/303 |
| 3,395,320 | 7/1968 | Ansley | 317/235 AE |
| 3,283,170 | 11/1966 | Buie | 317/235 E |

*Primary Examiner*—John W. Huckert
*Assistant Examiner*—William D. Larkins
*Attorney*—Mueller & Aichele

[57] ABSTRACT

A monolithic photoresponsive array having a plurality of spaced-apart photocurrent collecting regions (photocells) extending into a semiconductor substrate from one major surface. Cross talk caused by lateral flowing of photocurrents between the various photocurrent collecting regions is substantially decreased (such decrease termed photocurrent isolation) by establishing a concentration of minority carriers effectively intermediate the photocurrent collecting regions which is substantially lower than the minority carrier concentration of the semiconductor material in which such photocurrents are flowing. In one embodiment, a region having the same conductivity type as the various photocurrent collecting regions is disposed between adjacent ones thereof and is short-circuited to the substrate such that the minority carrier concentration adjacent the shorted junction is equal to the thermal equilibrium minority carrier concentration. Such photocurrent isolation may be provided within islands of an integrated circuit die or chip having a plurality of such photocurrent collecting regions. Groups of such photocurrent collecting regions may be electrically isolated as by dielectric isolation or through junction isolation.

10 Claims, 14 Drawing Figures

INVENTOR.
ARNOLD LONDON

BY

Mueller, Aichele & Rauner
ATTORNEYS

*INVENTOR.*
ARNOLD LONDON
BY
Mueller, Aichele & Rauner
ATTORNEYS

PHOTOCURRENT CROSS TALK ISOLATION

This is a continuation of my copending application Ser. No. 797,202 filed Feb. 6, 1969 now abandoned.

BACKGROUND OF THE INVENTION

This invention relates to photoresponsive arrays formed in a monolithic semiconductive chip.

Arrays of photocells or other photo or radiation responsive devices have been utilized for the analysis of one or two-dimensional light patterns and for the storage of such light patterns on a transitory basis. For example, in imaging systems, such as television pickups, an array of photocells may be used to electrically produce signals indicative of the light image of a two-dimensional light pattern. Techniques have been developed and utilized for scanning such arrays of photocells such that a video signal is generated for transmission to a receiver or other utilization means. Such an array of photocells can be fabricated by an array of individual ones of such photocells, one separately packaged cell for each element of the image to be analyzed. However, in many instances, it is desired to analyze a light pattern by dividing the image into thousands of elements. The cost of an arrangement involving thousands of individual photocells is astronomical. Also, such an arrangement is contrary to the strong tendency in the electronics industry to make electrical and electronic units more and more compact. Such compactness with the associated reduction in weight enables an increased portability of such equipment and thereby makes such equipment more versatile. Compactness also gives greater resolution (more elements per unit length) than available if using individual units. Present fabrication techniques for monolithic structures give greater spacing uniformity to elements and smaller spacing dimensions than with discrete units.

Photocells have been formed in arrays on a single monolithic integrated circuit chip. Such arrays of photocells have quite commonly taken the form of a plurality of spaced-apart P-doped semiconductive regions formed in an N-doped semiconductive substrate or layer. A reverse-biased rectifying junction between the P and N regions collects minority carriers excited to a so-called migration state by radiation penetrating the semiconductive material, usually the substrate. For this reason, the P regions are termed "photocurrent collecting regions" as is later fully explained. Various electrical connections can be made to such an array with such photoexcited minority carriers being collected at each of the junctions between the respective P-doped regions and the N-doped substrate to form a photocurrent or a photovoltage if the junction is open circuited. Ohmic connections can be made to the regions and the substrate for transferring such photocurrents to sensing circuits and the like. Alternatively, a single ohmic connection can be made to the substrate with an electron beam utilized to interrogate the various regions for determining the response of the semiconductive material at a given junction to received and penetrating radiation.

When light or other radiated energy penetrates silicon semiconductive material, majority and minority carriers (hole-electron pairs) are created when photoenergy is sufficient to raise electrons from valence to conduction band. Migration or diffusion of such carriers then occurs — the so-called migration state — toward an area in the semiconductive material having a lower carrier concentration. For example, in an N-type semiconductive material positive charges, termed holes, are the minority carriers while free electrons (having a negative charge) are the majority carriers. In P-type semiconductive material, the reverse is true, i.e., holes are the majority carriers while free electrons are minority carriers. In either type of semiconductive material, a reverse-biased junction existing between such material and semiconductive material of an opposite conductivity type, the minority carrier concentration is zero, i.e., the depletion zone about a reverse-biased junction has all the minority carriers "-depleted" therefrom to form in effect an electric field caused dieelectric zone. Minority carriers energized by light radiation entering such semiconductive material are attracted to such zone of zero minority carrier concentration and are collected therein as a photocurrent as they are transported to the region of opposite conductivity type by the electric field existing in the depletion region. By connecting the junction to suitable circuits, such a photocurrent can be measured and used as an indication of the intensity of received radiation or light.

In an array of photocells in a monolithic semiconductive chip, depending upon the diffusion length and carrier lifetime of the semiconductive material, the migration of minority carriers in a migration state can be not only to a reverse-biased rectifying junction adjacent the semiconductive material which was illuminated but migration can be to other reverse-biased rectifying junctions remote from the illuminated material. Such migration to other junctions is termed "cross talk". It is desired in these photoresponsive monolithic arrays to have a good signal-to-noise ratio such that light discrimination is enhanced. Such cross talk can be eliminated by providing dielectric isolation between the various photocurrent collecting junctions. This type of isolation is quite expensive. Also, a PN junction can be provided surrounding the various array photocurrent collecting regions for providing electric isolation therebetween such as the isolation formed by items 14, 15 and 28 in FIGS. 1 and 2. This approach also requires an increased surface area due to lateral diffusion effects and therefore is relatively expensive. A major drawback if dielectric or junction isolation which completely surrounds individual photocurrent collecting regions is that two external leads are required for each element since the N-type substrate is no longer common to all photocurrent collecting elements. Junction or dielectric isolators extending a distance on the order of $1/\gamma$ into a N-substrate and which are similar in geometry to those isolators shown in FIG. 1 should serve as good carriers to cross talk photocurrent. Also, etched grooves extending into an N-substrate serve this same purpose. These schemes are either more expensive or more space consuming than the structure shown in FIG. 1. These prior art oscillators also provide a limitation on the density of such elements and thereby limits the resolution of a monolithic array of photocells. Another alternative approach is to reduce the sensitivity by reducing carrier lifetime in the semiconductive material. Such an approach prevents optimum sensitivity of a monolithic photoresponsive array. Yet another approach is to space the various photocell junctions a substantial distance apart, i.e., more than one diffusion length. This approach again limits the packing density of the photocurrent collecting regions in a monolithic photoresponsive array.

It is desired to have a photoresponsive monolithic array in a monolithic chip which has high sensitivity and is capable of high packing densities with low cross talk.

SUMMARY OF THE INVENTION

It is an object of this invention to provide a monolithic array of photocurrent collecting regions, sometimes called photocells, having good sensitivity with low cross talk.

It is another object of the invention to provide a monolithic array in accordance with the preceding object wherein photocurrent isolation is inexpensively provided without the requirement of additional process steps in fabrication thereof.

A feature of the present invention is the establishment of a low minority carrier concentration between adjacent minority carrier collection regions for providing photocurrent isolation.

A feature of the present invention is the collection of minority carriers in a monolithic array in a migration state to an area effectively intermediate two adjacent photocurrent collecting regions. Such collection is accomplished by maintaining a low minority carrier concentration in the collection area.

A feature of the present invention is the effective interposition between two adjacent and electrically connected photocurrent collecting regions in a monolithic array of means for maintaining a low minority carrier concentration to collect minority carriers energized by received radiation to thereby reduce photocurrent cross talk between photocurrent collecting regions in such monolithic array.

Another feature of the present invention in conjunction with the immediately preceding feature is the utilization of an auxiliary junction between two photocell junctions, which auxiliary junction develops and maintains a minority carrier concentration equal to the thermal equilibrium minority carrier concentration of the semiconductive material in a monolithic array.

In one embodiment of the present invention, an array of photocurrent collecting regions is provided in a single monolithic chip with an auxiliary semiconductor region between each of the adjacent photocurrent collecting regions, which auxiliary semiconductor region is short-circuited to the monolithic chip such that the minority carrier concentration adjacent the auxiliary region is equal to the thermal equilibrium minority carrier concentration. The auxiliary region may be formed (as by diffusion) at the same time as the regions forming the photocurrent collecting regions are formed. In a large array of such photocurrent collecting regions, the array can be formed in columns and rows. Each row of photocurrent collecting regions can be electrically isolated from all other rows. Such electric isolation may be provided by a junction formed by an isolation diffusion through an intermediate region of the monolithic array. Each of the photocurrent collecting regions in the respective columns is photocurrent isolated one from the other by such auxiliary semiconductor regions being disposed therebetween. The auxiliary semiconductor regions preferably extend beyond the extremities of adjacent photocurrent collecting regions.

The auxiliary semiconductor region may extend only between two adjacent photocurrent collecting regions. Alternatively, such auxiliary semiconductor region may completely ring or encircle the junction, although it is not necessary so to do. In another version, a groove is formed between adjacent photocurrent collecting regions. When such photocurrent collecting regions are formed by diffusion, there is also formed the auxiliary semiconductor region by diffusion of impurities through the groove and into the underlying semiconductive material. It is not necessary that the auxiliary region have the same junction depth as the photocurrent collecting regions. The monolithic array of photocurrent collecting regions can be used in a continuous output mode; may be used with ohmic connections or with electron beam interrogation or other forms of selection. Another structure for providing a low minority carrier concentration is the placement of a metal member on the surface of N-type semiconductive material. It is preferable to alloy or sinter the metal into the semiconductor.

As used herein, the terms "effective interposition" or "effectively intermediate" and the like mean a position in a platelike monolithic array of photocurrent collecting regions such that minority carriers moving laterally, i.e., parallel to the major surfaces of such monolithic array, are attracted thereto by the low minority concentration to thereby attract a certain portion of such laterally moving minority carriers into such interposed low minority carrier concentration area.

THE DRAWINGS

DETAILED DESCRIPTION OF THE ILLUSTRATIVE EMBODIMENTS

Figure 1:
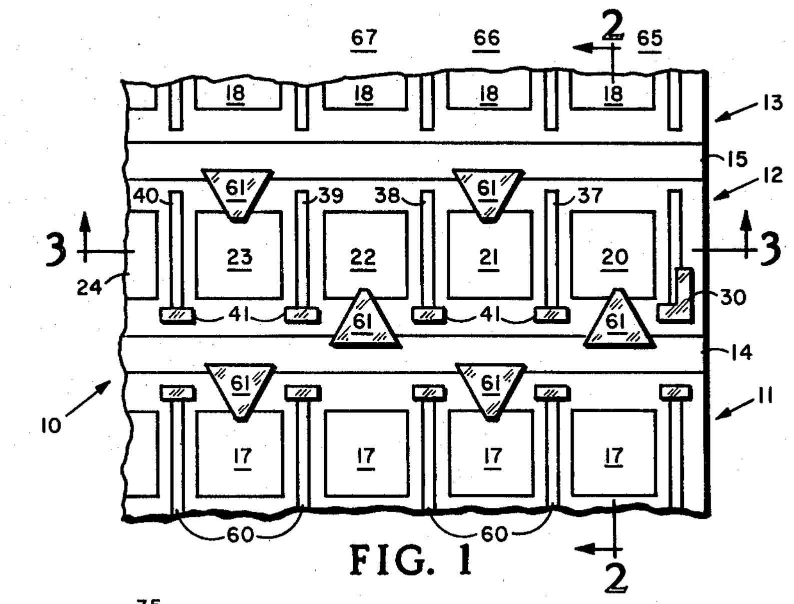
FIG. 1 is a diagrammatic and enlarged partial showing in plan view of a monolithic chip incorporating the teachings of the present invention.
Figure 2:
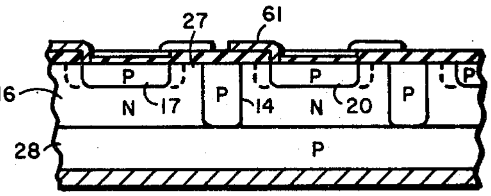
FIG. 2 is an enlarged diagrammatic partial cross-sectional view taken in directions of the arrows along line 2—2 of FIG. 1, and shows two photocurrent collecting regions isolated one from the other by an isolation diffusion and shows the relationship of auxiliary semiconductor region photocurrent isolation in two columns of a monolithic array.

Referring more particularly to the appended drawings, like numerals indicate like parts and structural features in the various views. Referring to FIG. 1, a monolithic chip 10 has a plurality of columns of photocurrent collecting regions forming a like plurality of photocells in the columns 11, 12 and 13 which are respectively electrically isolated one from the other by the isolation diffusion formed pillars 14 and 15. Column 11 includes a plurality of P-type semiconductor photocurrent collecting regions 17 formed by diffusions into an N-type semiconductor layer 16 of the monolithic chip 10. Each of the junctions between the photocurrent collecting regions 17 and the N layer 16 collect minority carriers to form a photocurrent as hereinafter described. Column 13 has a plurality of similar P-type regions 18 electrically isolated from the columns 11 and 12 by the P isolation diffusion reaching through the N-type layer 16 to P-type base layer or substrate 28 as shown in FIG. 2. While it has been shown that the P-type regions are formed into an N-type layer over a P-type substrate, no limitation of this invention to such particular conductivity types is intended. It is equally permissible to have a P-type layer with a plurality of N-type regions extending therein in the same manner that P regions 17 – 24 extend into the N layer 16 shown in FIG. 1.

Column 12 has a plurality of P-type photocurrent collecting regions 20, 21, 22, 23 and 24 formed therein in the same manner as for the other columns. Insofar as photocurrent cross talk between the various photocurrent collecting regions is concerned, isolation diffusion formed pillars 14 and 15 between the upper main surface 27 and the substrate 28 of FIG. 2 electrically isolate the columns of photocurrent collecting regions one from the other. Therefore, the only photocurrent cross talk that is possible is between the photocurrent collecting regions in a given column. Such electrical isolation is sufficient to prevent an electrical circuit from being formed through isolation diffusions. The photocurrent cross talk isolation provided by the present invention permits an electrical circuit to be completed. For purposes of discussion, only column 12 is described in detail.

Before proceeding further, the photoresponsiveness of a monolithic array of semiconductor photocurrent collecting regions and rectifying junctions as collectors of photocurrents is described especially with respect to the problem of electrical cross talk between such regions due to minority carriers generated by the photoelectric effect on the semiconductive material. The U.S. Pat. to F. W. Reynolds entitled "Solid-State Light Sensitive Storage Device", No. 3,411,089, suggests an array of reverse-biased electrically isolated diodes as an image sensing target. Such diodes correspond to the photo-current collecting regions in the present disclosure. The semiconductive substrate preferably has a resistivity of greater than one ohm-centimeter, up to about 10 ohm-centimeters. An array of such silicon diodes is also described in an article by Crowell et al., entitled "An Electron Beam-Access, Image-Sensing Silicon-Diode Array with Visible Response", Section 12, Solid-State Circuit Applications of the Proceedings of the International Solid-State Circuits Conference, page 128, Feb. 17, 1967. Light energy impinging and then penetrating semiconductive material, as silicon, releases minority carriers in the N-type layer 16 with the array up to a distance from the surface receiving such light equal to the reciprocal of the absorption coefficient for such light at the wavelength of interest. That is, light intensity, I, a distance $x$ below surface is given as $I = I_o \exp(-\gamma x)$ where $I_o$ is incident intensity. Generated hole-electron pair density is proportional to $I$. This is expressed as the mean penetration depth $1/\gamma$, from the surface of the semiconductor. For maximum photoelectric sensitivity, the minority carrier diffusion length $L_p$ should be as high as possible since the quantum collection efficiency $\eta$ for a given region is expressed by:

$$\eta = \gamma L_p/(1 + \gamma L_p) \qquad (1)$$

wherein $\gamma$ is the absorption coefficient for light and $L_p$ is the diffusion length. The diffusion length is equal to the square root of the minority carrier lifetime multiplied by the diffusion constant, as is well known. Typical values of these parameters for silicon are:

$$1/\gamma \approx 25\ \mu \text{ at a wavelength of } 9{,}000\ \text{A}$$

(9,000 A corresponds to a wavelength of energetic radiation emission from a tungsten source and is very nearly equal to the wavelength of emission of a gallium arsenide light emitting diode), $L_p = 30$ to $100\mu$ (minority carrier lifetime $= 10^{-6}$ to $10^{-5}$ sec., diffusivity $= 10\ cm^2/sec$).

As the incident radiation, such as light, having photo energy exceeding the forbidden gap energy of a semiconductive material penetrates a semiconductive material having an impurity dopant, the energy level of valence band electrons is raised sufficiently to elevate same to the conduction band. This raised electron energy level results in the creation of hole-electron pairs and increases the concentration of both majority and minority carriers in the semiconductive material and enables minority carriers to diffuse or migrate toward a section of the semiconductive material having a lower minority carrier concentration than the concentration in which a given minority carrier presently resides. The minority carrier concentration (for holes in N-type material) at the depletion region edge, $P_n(0)$ is given by $P_n(0) = P_{no}\exp(qV/kT)$ where $P_{no}$ is thermally generated minority carrier concentration and $V$ is applied voltage. If conditions are such that $P_n(0)$ is less than photogenerated carrier concentration and $P_{no}$, a diffusion or migration of minority carriers proportional to the gradient of $P_n$ ($\nabla P_n$) in the N-region occurs in the direction of the junction depletion region. This raised energy state is termed a migration state. The closer the particular minority carrier is to the area of low minority carrier concentration, the greater the attraction for migration and, therefore, the greater the probability a given minority carrier will move into such area of lower minority carrier concentration. A reverse-biased rectifying junction between two semiconductor regions of opposite conductivity type semiconductive material contains what is termed a depletion zone which is swept clear of minority carriers. In other words, the minority carrier concentration within a depletion zone is zero. Therefore, all the minority carriers energized to such migration state adjacent such a depletion zone tend to migrate into such zone. This minority carrier energizing action, of course, varies with the characteristics of the penetrating radiation, such as wavelength.

Figure 3:
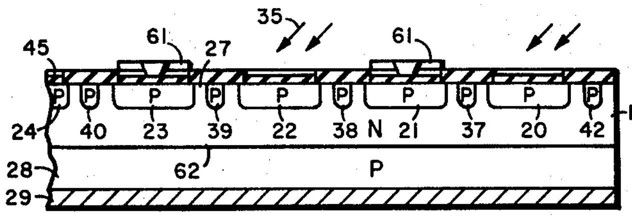
FIG. 3 is a diagrammatic enlarged cross-sectional view taken in the direction of the arrows along line 3—3 of FIG. 1 showing photocurrent collecting regions and isolating auxiliary semiconductor regions therebetween along one column of a monolithic array.

As minority carriers in such migration state migrate into the depletion zone of a reverse-biased junction, they are swept by the electric field existing therein to the region of opposite conductivity type, and generate or collect a current flowing through the reverse-biased junction which is termed a "photocurrent". This extends beyond the extremity of the P-type regions 20 through 24 as best seen in FIG. 2. As seen in FIG. 3, the depth of the auxiliary regions 37, 38, 39, 40 and 42 is the same as that of the P-type regions 20 through 24. Generally, the deeper the auxiliary regions extend into N layer 16 with respect to P-type photocurrent collecting regions forming the photoresponsive elements in the array, the better the photocurrent cross talk isolation. In the illustrated embodiment, the auxiliary P-type regions 37, 38, 39, 40 and 42 were formed simultaneously with the diffusion of the P-type regions 20 through 24 through suitable apertures in the passivating oxide coating 45. It is understood that the passivating coating 45, as shown, consists of a plurality of oxide layers formed during the various diffusions in the formation of the monolithic array. The thickness of the passivating layer 45 over the P-type regions 20 through 24 is less than that over the remainder of the monolithic chip. The oxide is quite transparent to wavelengths at which the illustrated device is sensitive (35 ⊟1.1$\mu$ in silicon). Reduced thickness over range of practical values available does not substantially reduce absorption of incident radiation. Coatings other than oxide may be more absorptive, however, Since thin film interference occurs in the oxide, its thickness is generally made to cause constructive interference at wavelengths of desired maximum sensitivity. No limitation thereto is intended.

Figure 4:
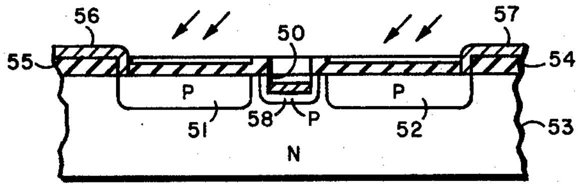
FIG. 4 is an enlarged diagrammatic partial cross-sectional view of an embodiment of the present invention wherein an auxiliary semiconductor region is formed in a groove between two adjacent photocurrent collecting regions.

While the FIGS. 1 – 3 illustrated embodiment shows the auxiliary regions contiguous with the flat upper surface 27, no limitation thereto is intended. For example, in FIG. 4, a groove 50 is formed between two adjacent P-type regions 51 and 52, respectively, extending into an N-type region 53 from major surface 54 passivated by oxide layer 55. Metallic contact 56 forms an ohmic connection to P-type region 51 while metallic contact 57 forms an ohmic contact to P-type region 52. The auxiliary region 58 electrically shorted to N-type substrates 53 is formed by a diffusion of P-type impurities through the bottom of the groove 50 such that it extends below the deepest penetration of the P-type photocurrent collecting regions 51 and 52 for providing improved photocurrent cross talk isolation. It should be noted that the depth of the auxiliary region 58 is limited by the spacing between the P regions 51 and 52 since the diffusion of the dopant impurities travels in all directions simultaneously. Therefore, the utilization of the groove 50 permits a deeper penetration of an auxiliary diffusion formed region into the N-type layer 53. For some photocurrent cross talk reduction, it is not absolutely necessary to have the auxiliary regions extend to the depth of the photocurrent collecting regions.

Turning again to FIG. 1, auxiliary regions 60 are disposed between the P-type photocurrent collecting regions 17 in column 11. The auxiliary regions 60 are formed and shaped in the same manner as the auxiliary regions previously described. The column 13 has a similar set of auxiliary regions for providing photocurrent cross talk isolation between its P-type photocurrent collecting regions 18. The FIG. 1 illustrated array utilizes the metallized areas or contacts collectively designated by numeral 61 to make individual electrical ohmic connections to the various illustrated P-type photocurrent collecting regions. The metallized areas 61 extend very little over the P-type regions as best seen in FIG. 3. The purpose of this arrangement is to maximize the area of the P-type regions exposed to incident radiation for maximizing sensitivity.

The isolating P-regions 28 and 14 of FIG. 2 do not have to be reverse-biased with respect to regions 16. It is quite effective in isolating N-regions on the same monolithic chip so long as the N-regions to be isolated are completely surrounded by a continuous P-region. This junction isolation technique, requiring no external bias is extensively used in the industry today. A small N+ diffused region beneath electrode 30 and electrodes 41, would provide better ohmic contact of shorting electrode to region 16. Electrode 30 provides an ohmic connection to N-type layer 16 in column 12. Each column in the array has a similar electrode (not shown). This ohmic connection can be used for completing electrical circuits with the various photocurrent collecting regions 20 – 24. Since the photocurrent collecting regions in the various columns along one row are electrically isolated one from the other, a coordinate selection system may be utilized to select which device is to be interrogated. For example, if P-type photocurrent collecting region 21 is to be sensed for incident radiation, then an electrical switch (not shown) connects electrode 30 to a photocurrent sensing circuit (not shown). Each of the columns 11 and 13. etc., in the array would have a similar electrode (not shown) connected through a switch (not shown) for making an ohmic connection between the N-type layer therein to such a sensing circuit (not shown). All of the P-type photocurrent collecting regions in the various rows, i.e., the rows on the right-hand edge of the array as seen in FIG. 1, are designated row 65, the next adjacent row is row 66 and the next 67, etc. All of the metallized areas 61 in a given row are ohmically connected together, that is, the contacts in row 66 are connected together by a metallization (not shown). To select photocurrent collecting region 21, the contacts in column 66 are connected through another switch (not shown) to a photocurrent sensing circuit (not shown) as is contact or electrode 30. These connections complete an electrical circuit which includes only the junction between photocurrent collecting region 21 and N-type layer 16 of column 12. It is apparent from well known techniques that any one of the photocurrent collecting regions in an array can be so selected or addressed. Such selection forms no part of the present invention but is mentioned only to illustrate how a monolithic array may be utilized.

Figure 5:
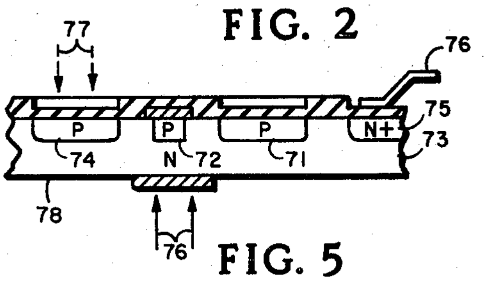
FIG. 5 is a diagrammatic enlarged cross-sectional partial view of another embodiment of the present invention responsive to electron interrogation of various photocurrent collecting regions in a monolithic array.

In some instances, it is desired not to have a large number of ohmic connections as just described. In such an instance, the selection may be through a beam of electrons focused on a given photocurrent collecting region. Since electron beams can be scanned rather rapidly, a rapid scanning of an array is possible. Referring next to FIG. 5, there is shown in diagrammatic form a partial array of photosensitive devices wherein there are two P-type photocurrent collecting regions 74 and 71 with a P-type auxiliary region 72 grounded to the N-type layer 73 at 78. A single ohmic connection is made through N+ region 75 to wire 76 attached thereto in the usual manner. The light to be analyzed is received through the N-type layer 73 as indicated by arrows 76. This may be a collimated beam, a laser beam or may be a two-dimensional light image to be analyzed by a circuit (not shown). In any event, the light impinging upon N-type layer 73 immediately adjacent photocurrent collecting region 74 is measured by focusing an electron beam indicated by dotted arrow 77 solely on P-region 70. The electron beam has a cross-section preferably somewhat smaller than the photocurrent collecting region 74 (although it may be just as large) and charges the P-type photocurrent collecting region 74 for reverse biasing the rectifying junction between region 74 and layer 73. The incident light indicated by arrows 76 migrates to such reverse biased junction causing a photocurrent in layer 73 which discharges region 74 reducing the reverse biasing of such junction (compare with the discharge of a capacitor). Such discharge results in an electrical current output through wire 76. With rapid scanning, the output photocurrent is treated as a video signal.

The majority of the photoenergized minority carriers are adjacent the illuminated surface. Since the light image is focused upon the surface opposite the photocurrent collecting regions 74 and 71, a thin N-type layer 73 is required to permit the received light to penetrate into layer 73 near regions 74 and 71. It is desirable that thickness of region 73 be on the order of $1/\gamma$ corresponding to wavelength of desired maximum sensitivity. Otherwise, the minority carriers may not migrate toward the depletion region formed by the reverse-biasing of the junctions between regions 74, 71 and layer 73.

Figure 6:
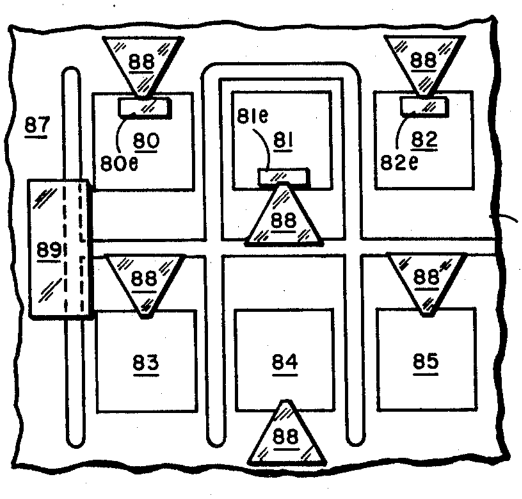
FIG. 6 is a diagrammatic enlarged partial plan view of an embodiment of the present invention wherein an auxiliary semiconductor region is continuous between plural adjacent photocurrent collecting regions in a monolithic array.

Referring next to FIG. 6, there is shown in plan view additional layouts of arranging photocurrent isolation by the use of an auxiliary region. A plurality of semiconductor regions 80 through 85 are formed in a suitable substrate of opposite conductivity type semiconductive material 86. These regions 80 – 85 collect photocurrents in the same manner as above described for the other illustrated embodiments. A single auxiliary region 87 is formed as shown and is understood to preferably extend to a depth with respect to the junction depths of the regions 83, 85 the same as the relative depths of elements 37 and 20 in FIG. 3. Substrate 86 is a semiconductive sheet having no isolation that would prevent flow of current therethrough as pillars 14 and 15 (FIG. 1) interrupt the electrical continuity of layer 16 into columnar strips. The plurality of ohmic connections are made by the metallized areas 88 to the respective regions 80 through 85. An ohmic connection to the substrate 86 is through metallized area 89 which also shorts auxiliary region 87 to substrate 86. If the internal resistance of auxiliary region 89 is quite high, additional shorting metallized areas should be used. In the FIG. 6 illustrated embodiment, it is assumed that the current flowing in auxiliary region 87 is sufficiently low that the voltage drop therein will not seriously impair isolation. Region 81 is completely surrounded by a portion of auxiliary region 87 while all the other regions 80, 82, 83, 84 and 85 are surrounded on three sides by the auxiliary region. Such an arrangement is provided when an isolation diffusion, such as isolation diffusion formed pillar 14 (FIG. 2) is not used to electrically separate devices into columns. In the alternative, a plurality of separate regions of the bar type as shown for regions 37 through 40 in FIG. 1 may be formed and still provide good photocurrent cross talk isolation between adjacent photocurrent collecting regions. Without the isolation diffusion, of course, it should be remembered there is no true electrical isolation between the various columns requiring a different selection technique than that described with respect to the FIG. 1 illustration. In such an instance, the selection technique described with respect to FIG. 5 or others may be utilized.

Figure 14:
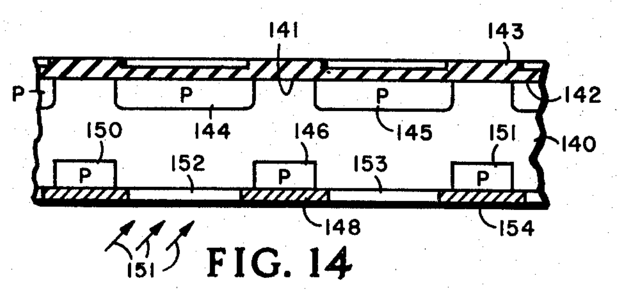
FIG. 14 is an enlarged diagrammatic partial cross-sectional view of a monolithic array of photocurrent collecting regions having a minority carrier collection means effectively interposed between two adjacent photocurrent collecting regions but operative from a major surface of the monolithic chip opposite to the major surface at which the junctions of such regions are terminated.

It is also understood that a plurality of photocurrent collecting regions may be formed without an auxiliary region separating them. For example, region 81 as shown in FIG. 6 may actually consist of a plurality of separate P-type regions. Therefore, groups of photocurrent collecting regions may be isolated from cross talk photocurrents in the described manner as well as individual ones of such regions. Also, with respect to the FIG. 5 embodiment, the auxiliary region 72 may extend into N-type layer 73 from the opposite surface 78 as shown in FIG. 14. This is usable when N-type layer 73 is thin (thin means the impinging radiation can penetrate the layer 73 sufficiently to energize minority carriers adjacent the photocurrent collecting regions 74 and 71) and it is desired to place the photocurrent collecting regions 74 and 71 close together. In this latter situation, the depth of auxiliary region 72 is not limited by the spacing between the regions 74 and 71. It also tends to decrease the photoresponsive efficiency since the photoenergized minority carriers adjacent surface 78 tend to migrate to the auxiliary region because of the close spacing thereto. Therefore, the auxiliary region, when extending into N layer 73 from surface 78, should be made small to reduce its current carrying capacity.

Photocurrent collecting regions 80 and 82 have emitter regions 80*e* and 82*e* disposed therein. As such, regions 80 and 82 are the base regions of two phototransistors. Layer 86 is the collector. The photosemiconductive interactions are as hereinbefore described, i.e., the energization of the minority carriers in the base (photocurrent collecting) regions. The incident radiation controls the conductivity between the emitter regions 80*e* and 82*e* and collector or substrate 86 by injection of energized minority carriers into the reverse-biased collector-base junction in a well known manner. The output current is the photocurrent as herein described multiplied by the current gain of the phototransistor structure.

Figure 7:
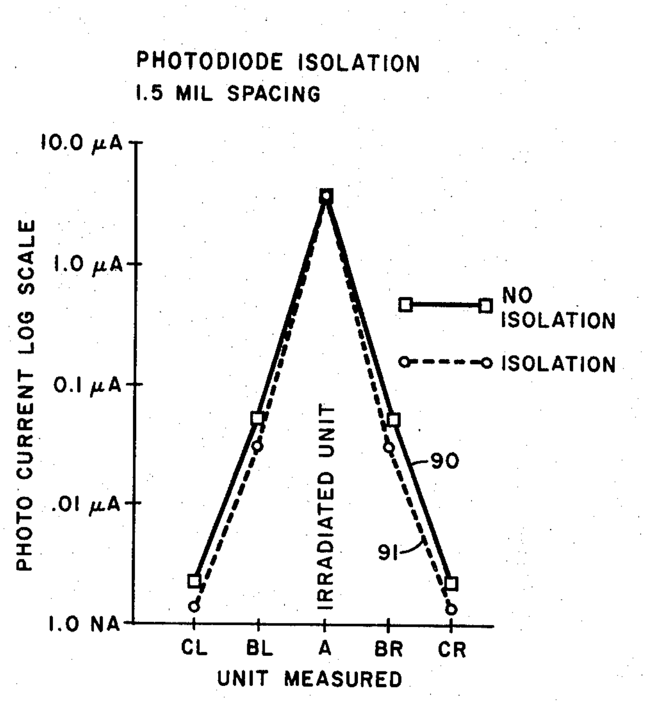
FIG. 7 is a graph showing the effect of an auxiliary semiconductor region for providing photocurrent isolation of adjacent photocurrent collecting regions in a monolithic array.

FIG. 7 is a graph showing the effect of the cross talk photocurrent isolation of an auxiliary region disposed between two adjacent photocurrent collecting regions in a monolithic array. The data in FIG. 7 is based upon photodiodes formed in a monolithic array with 1.5 mil spacing therebetween. Lines 90 show the response of the various diodes when there is no isolation, whereas dotted line 91 shows the response with the auxiliary region isolation of the present invention. The diode A indicates the irradiated unit which collects a photocurrent in excess of one microampere. The two immediately adjacent photoresponsive diodes are respectively labeled BR and BL. If element A included photocurrent collecting region 22 of FIG. 1, then element BR includes photocurrent collecting region 21 and element BL includes photocurrent collecting region 23. Without isolation the immediately adjacent elements collected a photocurrent of approximately 0.08 microamperes. This photocurrent was measured with diode A irradiated and diodes B not irradiated and therefore represents cross talk caused by minority carrier migration. With the cross talk isolation shown in FIGS. 1 – 3, the cross talk was reduced from approximately 0.08 microamperes to approximately 0.04 microamperes. If the spacing between the photodiode photocurrent collecting region had been decreased, the change in cross talk would be more pronounced. Also, if sensitivity of diode A had been greater, the change would be more pronounced. (Higher sensitivity is provided by higher minority carrier lifetime.) It is to be remembered that the spacing of 1.5 mils between adjacent semiconductor regions is quite large.

The ordinants CR and CL respectively represent photodiodes spaced from the irradiated unit by an intervening unit corresponding respectively to regions 20 and 24 of FIG. 1 when region 22 is irradiated. Note that the decrease in cross talk is not significant with the provided spacing. Therefore, this test shows that with the 1.5 mil spacing between the adjacent photodiodes and the monolithic array, there is a fair reduction of cross talk between an irradiated unit and immediately adjacent units. The test represented in FIG. 7 is with the irradiated unit open circuited when the other elements B and C were measured. If there is simultaneous readout from all of the photodiodes, there is less cross talk because their irradiated unit is drawing current by collecting minority carriers.

Figure 8:
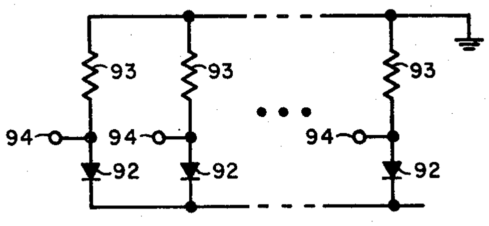
FIG. 8 is a simplified and abbreviated schematic diagram of an array of photocells consisting of semiconductor diodes having a continuous output signal.
Figure 9:
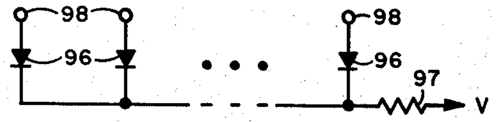
FIG. 9 is a simplified and abbreviated schematic diagram of an array of photocells consisting of semiconductor diodes suitable for scanning.

Referring next to FIG. 8, there is shown a photodiode array in schematic diagram form which provides a continuous output signal. A plurality of diodes 92 have a common cathode connection to a voltage supply V with their anodes connected respectively through a plurality of resistors 93 to a ground reference potential. Whenever any one of the diodes is irradiated, a signal is supplied on the respective output terminal 94. FIG. 9 is another schematic diagram of a photodiode array on which the data in FIG. 7 was based. The plurality of photodiodes 96 have a common cathode connection through a load resistor 97 to voltage supply V. Each of the diodes has its anode connected independently to a respective output terminal 98. To sense a given photodiode, an electrical connection must be made from a sensing circuit (not shown) to the respective output terminal 98 which includes reverse-biasing the respective photodiodes. The FIG. 9 illustrated schematic diagram is useful for scanning the array with one electrical connection being made to only one photodiode at a given time. Therefore, if a diode is being irradiated but not sensed, it corresponds to an open circuit connection which gives rise to the greatest amplitude of cross talk caused by migration of minority carriers.

Figure 10:
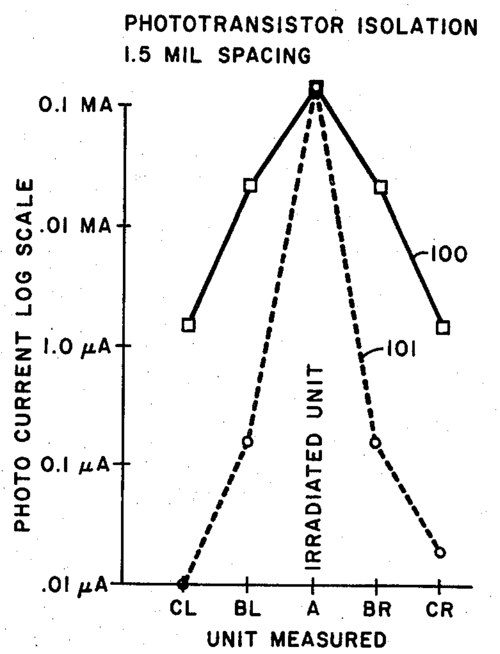
FIG. 10 is a graph illustrating the effect of an auxiliary semiconductor region for photocurrent isolation of adjacent photocurrent collecting regions included in phototransistor structures.

Many of the monolithic photoresponsive arrays utilize photoresponsive transistors rather than diodes to take advantage of the current gain of such transistors. That is, a larger output current is provided from a phototransistor than from a photodiode. The effective cross talk on the output currents of a phototransistor would be expected to be more greatly pronounced than it would be for photodiodes and tests recorded on which FIG. 10 is based show this to be true. The units are labeled A, BR, BL, CR and CL indicating the same geometric relationship as for the photodiodes tested for FIG. 7 illustration. Line 100 indicates the current amplitude of the various units without isolation while dotted line 101 indicates the relative current amplitudes with isolation. The irradiated unit A supplied an output current of approximately 0.12 milliamperes (note: the photodidoe output photocurrent was measured in microamperes). With no isolation the B units supplied an output current of approximately 0.03 milliamperes or a 4 to 1 signal-to-noise ratio. The isolated B units supplied an output current of approximately 0.06 microamperes. This is a 500 to 1 reduction in photocurrent cross talk due to minority carrier migration provided by utilization of a minority carrier collection means disposed between two adjacent photocurrent collecting regions in a monolithic array (the base region of the phototransistor is the photocurrent collecting region as that term is used in this specification). The cross talk improvement in the once removed photoresponsive elements CR and CL was just as pronounced. Without isolation, the output currents of the photocurrent collection devices CL and CR with an intervening photocurrent collection device between the irradiated device and CL and CR had an output current of approximately 1.1 microamperes while with isolation, the output current was reduced to approximately 0.01 microamperes, an improvement of over 100 to 1 in signal-to-noise ratio due to cross talk. This improvement is provided with the same 1.5 mil spacing between adjacent phototransistors. With closer spacing, the improvement in signal-to-noise ratio provided by this invention would be more pronounced. Again, for higher sensitivity devices the ratio would be more pronounced. Sensitivity is now a function of both minority carrier lifetime and the transistor gain.

An examination of FIGS. 7 and 10 also shows that without isolation and with isolation the output photocurrent amplitude of irradiated unit A was approximately the same. The tests were conducted using the same light source at the same distance. The above described tests were also performed where isolated and unisolated units (transistors or diodes) were on the same silicon chip, which makes comparison valid. The previously referred to tungsten source was used in conducting these tests. In other words, the utilization of the minority carrier collection means to provide cross talk isolation between adjacent photoresponsive elements need not impair the collection efficiency of the irradiated unit. This is extremely important in the maintenance of high sensitivity in monolithic photoresponsive arrays.

Figure 11:
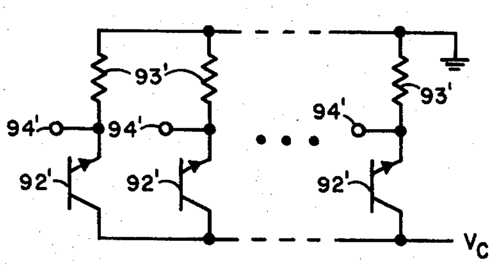
FIG. 11 is a simplified and abbreviated schematic diagram of an array of phototransistors supplying a continuous output signal.
Figure 12:
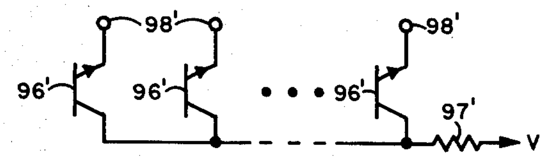
FIG. 12 is a simplified and abbreviated schematic diagram of an array of phototransistors suitable for a scanning operation to provide intermittent output signals.

The circuit arrangement for sensing a phototransistor is basically the same as sensing for the photodiodes. Referring to FIGS. 11 and 12, the same numerals primed (′) are utilized to designate the elements of a phototransistor circuit. Also, in the scanning mode, the diodes must be open circuited to be off while the transistors can be either open circuited or line 98′ can be at V potential (i.e., the device is shorted) to be off.

Figure 13:
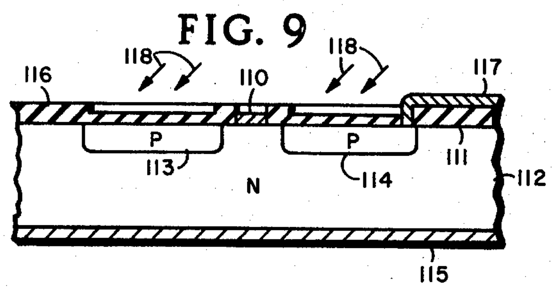
FIG. 13 is an enlarged diagrammatic cross-sectional view of a metallic layer on a semiconductor layer used as a means for maintaining a low minority carrier concentration between adjacent photocurrent collecting regions in a monolithic array.

Another embodiment of the present invention is shown in FIG. 13 wherein metallization 110 resides on upper surface 111 of N-type semiconductive substrate 112 and forms a low minority carrier concentration intermediate a pair of photocurrent collecting P-type regions 113 and 114. Electrode 115 may be disposed on the underside of substrate 112. The passivating oxide layer 116 is disposed on the upper surface 111 for passivating the junctions of the photocurrent collecting regions. A metal electrode 117 makes ohmic connection to region 114. A similar ohmic connection (not shown) ohmically connects photocurrent collecting region 113 such that a measuring circuit can be completed from the electrode to the substrate electrode 115.

The theory of photocurrent cross talk isolation through the deposition of metal 110 intermediate the two photocurrent collecting regions 113 and 114 is that the metallization 110 has a great excess of free electrons. This corresponds to a low minority carrier concentration in that the excess of free electrons attract holes, the minority carriers of N-type semiconductive material. Therefore, in the semiconductor area immediately below surface 111 in the proximity of metal 110, there will be an effective low concentration of minority carriers, i.e., holes, immediately adjacent to the metal because of the acceptability of such holes within the metal layer 110. This low minority concentration attracts minority carriers energized by the received radiation indicated by arrows 118 on either or both of the photocurrent collecting regions 113 and 114. No electrical connection need be made to metal layer 110. It is capable of almost infinite acceptance of hole type minority carriers from substrate 112. Metal layer 110 may be vapor deposited on surface 111, may be sintered thereto, may be alloyed to substrate 112 to form either a good ohmic contact of the alloy type of a rectifying junction.

Turning next to FIG. 14, yet another embodiment of the present invention is illustrated. In this embodiment, an N-type substrate 140 having an upper surface 141 is coated by a passivated oxide layer 143. A pair of photocurrent collecting P-type regions 144 and 145 extend into substrate 140 from upper surface 142 with the junctions between such regions and substrate 140 terminating at surface 142. The oxide coating over the photocurrent collecting regions 144 and 145 is kept thin as above described. It is desired that the junctions between regions 144, 145 and substrate 140 be kept so close together that it is impossible for an auxiliary region of the type described with respect to FIGS. 1 – 3 to be disposed therebetween and depend from upper surface 142. Therefore, in order to provide photocurrent cross talk isolation between the photocurrent collecting regions 144 and 145 due to radiation energized minority carriers, an auxiliary P-type region 146 extends into substrate 140 from lower surface 147. It is disposed intermediate on a horizontal axis of the photocurrent collection regions 144 and 145. The rectifying junction formed between auxiliary region 146 and substrate 140 is shorted to the substrate by the metallic layer 148. This arrangement causes the minority carrier concentration adjacent auxiliary region 146 to be at the thermal equilibrium minority concentration. Therefore, it attracts radiation energized minority carriers. When the radiation is received through the oxide layer 143, the metallization 148 may extend entirely across lower surface 147 to short out all such auxiliary regions, including the regions 150 and 151. However, if the radiation is received through lower surface 147, as indicated by arrows 151, then he metallization on the lower surface 147 is formed with windows 152, 153 and 154 respectively aligned in a vertical dimension with the photocurrent collecting regions 144, 145, etc. The incident radiation, indicated by arrows 151, passes through the window 152 to energize minority carriers adjacent photocurrent collecting region 144. The metallization 148 is also used as a mask for preventing the excitation of minority carriers in the areas adjacent photocurrent collecting regions other than region 144. (Metal elements 41 in FIG. 1 can also be shaped to perform a masking function.) For example, the metallization 148 shields the radiation 151 from the area of substrate 140 adjacent the photocurrent collecting regions 145. In a similar manner, radiation passing through window 153 is similarly somewhat shielded from the photocurrent collecting region 144. This adds to the cross talk photocurrent isolation because of the reduction of excitation of minority carriers near adjacent photocurrent collecting regions. The auxiliary region 146 collects minority carriers excited through the respective windows 152 and 153 in a manner as previously described for the other auxiliary regions in the other embodiments.

I claim:

1. A radiation responsive monolithic device, including the combination:

a first conductivity type monocrystalline semiconductive layer continuously electrically conductive throughout and having first and second oppositely facing major surfaces and a given minority carrier concentration;

a plurality of closely packed photocurrent collecting regions extending into said layer from said first major surface and having monocrystalline semiconductive material of a conductivity type opposite to said first conductivity type, and each region having a rectifying junction with said layer;

said semiconductive material in said layer being responsive to radiation penetrating therein to have minority carriers energized to a migration state, said minority carriers in said migration state being capable of lateral migration from adjacent one of said photocurrent collecting regions to another of said photocurrent collecting regions, said migration capable of causing a cross talk photocurrent in said another photocurrent collecting region; and minority carrier concentration means effectively interposed between adjacent ones of said photocurrent collecting regions, said minority carrier concentration means including auxiliary regions of semiconductive material of a type opposite said first type extending into said layer between said photocurrent collection regions so as to form rectifying junctions therebetween, and said concentration means further including means for electrically shorting said auxiliary regions to said layer such that said electrical shorting means maintains zero biases at said last mentioned rectifying junctions and a low minority carrier concentration at said auxiliary regions so as to trap and hold minority carriers migrating laterally to said auxiliary regions, thereby changing the lateral minority carrier flow to a circulating flow through said auxiliary regions and the regions immediately adjacent thereto, whereby said circulating current flow is confined to regions immediately adjacent said auxiliary regions, thereby effectively isolating said flow from said photocurrent regions.

2. The subject matter of claim 1 wherein said minority carrier concentration means establishes a minority carrier concentration between said spaced-apart photocurrent collecting regions approximately equal to the thermal equilibrium minority carrier concentration of the semiconductive material in said layer.

3. The subject matter of claim 1 wherein adjacent ones of said photocurrent collecting regions have a given length along a first direction and being spaced apart a given distance transverse to said first direction;

said auxiliary region disposed between said adjacent ones of said spaced-apart photocurrent collecting regions having a length along said first direction greater than said given length such that said auxiliary region extends beyond said adjacent ones of said spaced-apart photocurrent collecting regions and having a dimension transverse to said first direction less than said given distance.

4. The subject matter of claim 3 wherein said auxiliary region extends into said layer from said first major surface a depth approximately the same depth as said spaced-apart photocurrent collecting regions extend into said layer.

5. The subject matter of claim 3 wherein said layer has an outwardly opening groove in said first major surface extending in said first direction between each adjacent ones of said spaced-apart photocurrent collecting regions;

said auxiliary regions extending into said layer from the bottom of said groove such that depth of penetration of said auxiliary region into said layer is greater than the depth of penetration of said spaced-apart photocurrent collecting regions.

6. The subject matter of claim 3 further including a layer of said opposite conductivity type monocrystalline material contiguous with said second major surface;

said spaced-apart photocurrent collecting regions being formed in rows and columns;

said rows extending along said first direction and columns of said spaced-apart photocurrent collecting regions extending transversely to said first direction;

an elongated pillar of said opposite conductivity type semiconductive material extending from said second layer of said first major surface between each of said adjacent columns of said spaced-apart photocurrent collecting regions such that each column is electrically isolated from each and every other column to provide a plurality of said first layers, one said first layer in each column of said array; and said auxiliary regions being disposed between adjacent ones of said photocurrent collecting regions in each of said respective columns.

7. The subject matter of claim 3 wherein an auxiliary region extends completely around but spaced from at least one of said spaced-apart photocurrent collecting regions.

8. The subject matter of claim 3 wherein the distance between adjacent spaced-apart photocurrent collecting regions is less than 1.5 mils.

9. A photoresponsive semiconductor device, including the combination:

a first region of first conductivity type monocrystalline semiconductive material having a resistivity greater than one ohm-centimeter with a given diffusion length and having minority carriers excitable to a migration state by radiation penetrating said region and having a first major surface;

a photocurrent collecting region extending into said first region from said first major surface and having a second conductivity type monocrystalline semiconductive material with a rectifying junction between said first and photocurrent collecting regions, said junction adapted to collect minority carriers from said first region which are in said migration state; and an auxiliary region of said second conductivity type extending into said first region from said first major surface and spaced on said first major surface from said photocurrent collecting region substantially less than said given diffusion length and having an electrical connection to said first region for maintaining said auxiliary region biased at approximately the same potential as said first region such that minority carriers in said migration state in said first region approaching said photocurrent collecting region but disposed closer to said auxiliary region than said photocurrent collection region tend to reach said auxiliary region rather than said photocurrent collecting region because said biasing maintains a low minority carrier concentration at said auxiliary region so as to trap and hold minority carriers migrating laterally to said auxiliary region, thereby changing the lateral minority carrier flow to a circulating flow through said auxiliary region, said circulating flow being confined to regions immediately adjacent said auxiliary region, whereby said circulating flow is effectively isolated from and has a minimal effect on said photocurrent collecting region.

10. The subject matter of claim 9 wherein said auxiliary regions extend upwardly from said second major surface.

* * * * *